(12) United States Patent
Hsu et al.

(10) Patent No.: US 6,793,731 B2
(45) Date of Patent: Sep. 21, 2004

(54) METHOD FOR RECRYSTALLIZING AN AMORPHIZED SILICON GERMANIUM FILM OVERLYING SILICON

(75) Inventors: Sheng Teng Hsu, Camas, WA (US); Jong-Jan Lee, Camas, WA (US); Jer-shen Maa, Vancouver, WA (US); Douglas J. Tweet, Camas, WA (US)

(73) Assignee: Sharp Laboratories of America, Inc., Camas, WA (US)

(*) Notice: Subject to any disclaimer, the term of this patent is extended or adjusted under 35 U.S.C. 154(b) by 16 days.

(21) Appl. No.: 10/098,757

(22) Filed: Mar. 13, 2002

(65) Prior Publication Data

US 2003/0172866 A1 Sep. 18, 2003

(51) Int. Cl.$^7$ .............................................. C30B 33/02

(52) U.S. Cl. ........................................................ 117/3

(58) Field of Search ................................. 117/2, 3, 105

(56) References Cited

U.S. PATENT DOCUMENTS

| | | | | |
|---|---|---|---|---|
| 4,819,037 A | * | 4/1989 | Sakakibara et al. ............ 257/24 |
| 5,084,411 A | * | 1/1992 | Laderman et al. ........... 438/507 |
| 5,256,550 A | * | 10/1993 | Laderman et al. ........... 438/509 |
| 5,633,174 A | * | 5/1997 | Li ............................... 438/475 |
| 5,726,440 A | * | 3/1998 | Kalkhoran et al. ....... 250/214.1 |
| 5,735,949 A | * | 4/1998 | Mantl et al. ..................... 117/8 |
| 5,920,764 A | * | 7/1999 | Hanson et al. .................. 438/4 |
| 6,211,095 B1 | * | 4/2001 | Chen et al. .................. 438/766 |
| 6,313,016 B1 | * | 11/2001 | Kibbel et al. ................ 438/478 |
| 6,464,780 B1 | | 10/2002 | Mantl et al. ................... 117/90 |
| 6,562,703 B1 | * | 5/2003 | Maa et al. ................... 438/518 |
| 6,573,126 B2 | * | 6/2003 | Cheng et al. ................ 438/149 |
| 2003/0107032 A1 | * | 6/2003 | Yoshida ......................... 257/19 |
| 2003/0215990 A1 | * | 11/2003 | Fitzgerald et al. ........... 438/172 |

OTHER PUBLICATIONS

S. Mantl, B. Hollander, R. Liedtke, S. Mesters, H. J. Herzog, H. Kibbel, T. Hackbarth, "Strain relaxation of epitaxial SiGe layer on Si (100) improved by hydrogen implantation", Nuclear Instruments and Methods in Physics Research B 147 (1999) P.29–34.

T. Nakato, "Method for Forming GeSi Si SiO$_2$ Heterostructure Using Ge Implant" US patent # 5,792,679, Issued Aug. 11 1998.

S. T. Hsu and T. Nakato, "Ge–Si SOI MOS Transistor and Method of Fabricating Same" US patent #5,726,459, Issued Mar. 10 1998.

* cited by examiner

Primary Examiner—Nadine G. Norton
Assistant Examiner—Matthew Anderson
(74) Attorney, Agent, or Firm—David C. Ripma; Matthew D. Rabdau

(57) ABSTRACT

A method is provided for forming a relaxed single-crystal silicon germanium film on a silicon substrate. Also provided is a film structure with a relaxed layer of graded silicon germanium on a silicon substrate. The method comprises: providing a silicon (Si) substrate with a top surface; growing a graded layer of strained single-crystal $Si_{1-x}Ge_x$ having a bottom surface overlying the Si substrate top surface and a top surface, where x increases with the $Si_{1-x}Ge_x$ layer thickness in the range between 0.03 and 0.5, wherein the $Si_{1-x}Ge_x$ layer has a thickness in the range of 2500 Å to 5000 Å; implanting hydrogen ions; penetrating the Si substrate with the hydrogen ions a depth in the range of 300 Å to 1000 Å; implanting heavy ions, such as Si or Ge, into the $Si_{1-x}Ge_x$; in response to the heavy ion implantation, amorphizing a first region of the $Si_{1-x}Ge_x$ layer adjacent the Si substrate; annealing; in response to the annealing, forming a hydrogen platelets layer between the Si substrate and the $Si_{1-x}Ge_x$ layer; forming a silicon layer with a high density of hydrogen underlying the hydrogen platelets layer; and, forming a relaxed single-crystal $Si_{1-x}Ge_x$ region, free of defects.

19 Claims, 3 Drawing Sheets

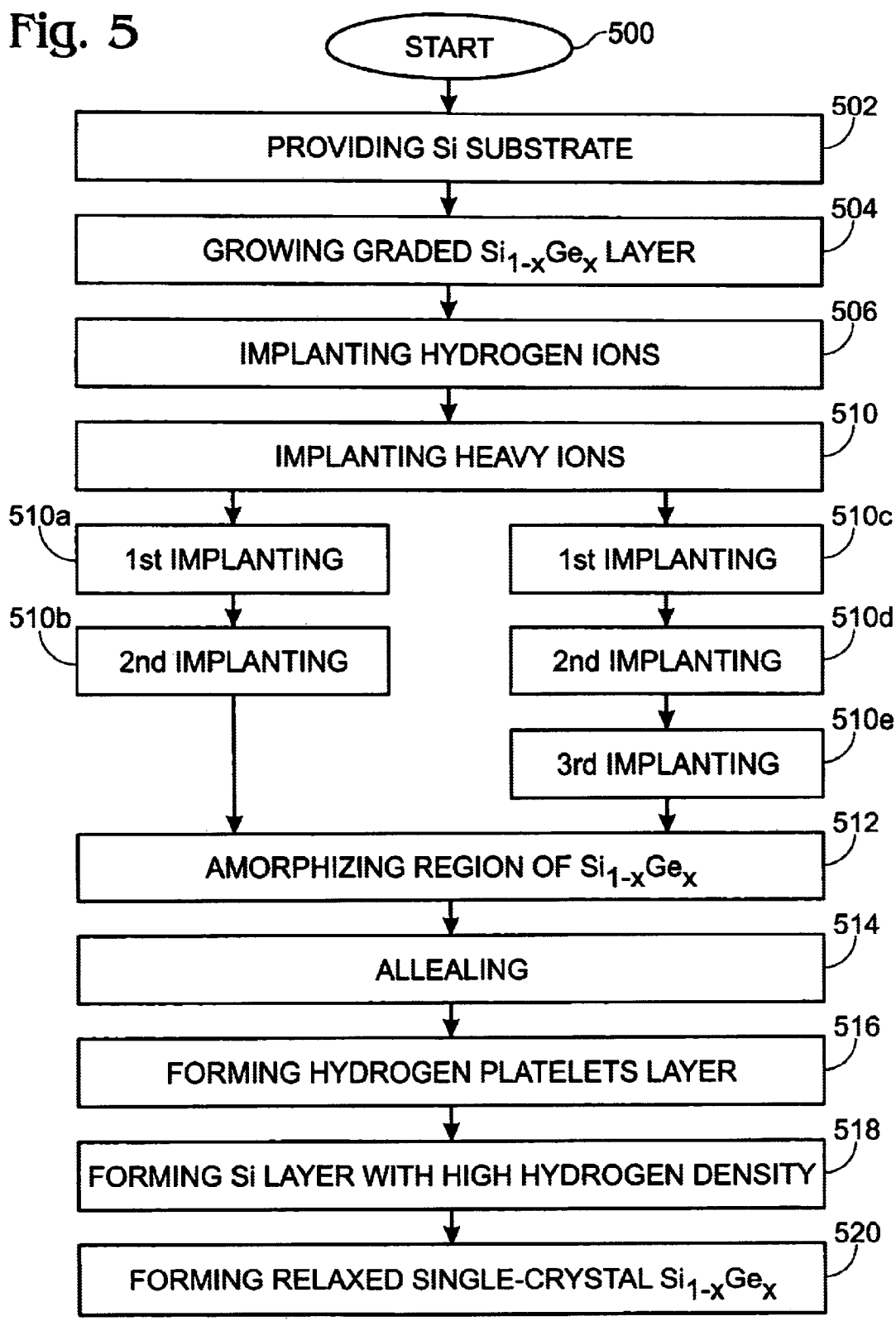

ated Si$_{1-x}$Ge$_x$ surface. However, hydrogen ion implantation/annealing alone is unable to reduce the defects to an acceptable density when SiGe films having a thickness of 250 nanometers (nm) to 400 nm are fabricated for very large scale integration (VLSI) applications.

It would be advantageous if thicker SiGe films could be fabricated, without defects, overlying silicon substrates.

It would be advantageous if the hydrogen ion implantation concept could be refined for reducing the number of defects along the interface between a Si substrate and an overlying SiGe film.

METHOD FOR RECRYSTALLIZING AN AMORPHIZED SILICON GERMANIUM FILM OVERLYING SILICON

BACKGROUND OF THE INVENTION

1. Field of the Invention

This invention generally relates to semiconductor fabrication and, more particularly, to a relaxed recrystallized silicon germanium film and method for amorphizing and recrystallizing to form a low defect density relaxed silicon germanium film on a silicon substrate.

2. Description of the Related Art

It is desirably to build transistors and integrated circuits using silicon germanium, as the silicon germanium layers have a higher electron and hole mobility than silicon. As a result, high drain drive current MOS transistors can be fabricated if the transistor active regions are formed over silicon germanium layers. Although the lattice structure of silicon and silicon germanium are similar, in the 110 orientation for example, lattice mismatch is a critical issue when silicon germanium (SiGe) is formed over silicon (Si).

SiGe can be grown over an underlying Si substrate so that the lattice structures of the two materials match. However, the tensile strained SiGe layer is not stable. It is well known that when SiGe is grown onto a silicon substrate, known as pseudomorphic growth, the SiGe layer is strained due to its larger than Si lattice size. There is a high density of defects at the Si to SiGe interface due to the mismatch of the lattice size. During subsequent fabrication steps, such as annealing, even more defects can occur the SiGe boundary with the Si and propagate upwards in the surface of the film. These defects degrade electron and hole mobility across the resultant device.

One approach to the problem has been to deposit a graded layer of SiGe where the content of the Ge varies. This composite film is designated herein as Si$_{1-x}$Ge$_x$. The layer of Si$_{1-x}$Ge$_x$ film near the underlying Si substrate interface can be made with a low Ge content for lattice matching. For thinner, fully strained Si$_{1-x}$Ge$_x$ films (with low Ge content), the top thin layer may have a low defect density, and the top surface can be very smooth. As the Ge content is increased, by either increasing film thickness or by increasing Ge density in the Si$_{1-x}$Ge$_x$ film, the strain in the Si$_{1-x}$Ge$_x$ is relieved by the generation of misfit dislocations at the Si$_{1-x}$Ge$_x$/Si interface. These misfit dislocations are accompanied by a high density of threading dislocations. Many of the threading dislocations extend to the surface of the Si$_{1-x}$Ge$_x$ epilayer.

It is known to use a thick layer of relaxed graded Si$_{1-x}$Ge$_x$, followed by another thick layer of buffered Si$_{1-x}$Ge$_x$ layer, and a silicon cap to fabricate high drain drive current MOS transistors. The total thickness is in the order of several microns and the defect density is still in the order of 1×10$^5$/cm$^2$. The thick Si$_{1-x}$Ge$_x$ layer and the high defect density of this conventional Si$_{1-x}$Ge$_x$ process make it unusable for large-scale integrated circuit fabrication.

It is known that strain relaxed high quality Si$_{1-x}$Ge$_x$ layers on Si can be obtained by hydrogen ion implantation and annealing. Hydrogen ion implantation forms a narrow defect band slightly below the SiGe/Si interface. During subsequent annealing, hydrogen platelets and cavities form, giving rise to strong enhanced strain relaxation in the Si$_{1-x}$Ge$_x$ epilayer. Hydrogen ions also terminate the threading dislocations, preventing the threading dislocations from

SUMMARY OF THE INVENTION

The present invention provides an amorphization process, followed by a recrystallization of Si$_{1-x}$Ge$_x$ film in conjunction with hydrogen ion implantation, for the minimization of defect density in the Si$_{1-x}$Ge$_x$ epilayer. This process produces a low defect density when forming 250 nm to 500 nm thick films of relaxed Si$_{1-x}$Ge$_x$ films, with a Ge content of up 30% to 50% at the top surface. The low defect densities, film thicknesses, and high Ge content support large-scale integrated circuit applications.

Accordingly, a method is provided for forming a single-crystal silicon germanium film on a silicon substrate. The method comprises: providing a silicon substrate with a top surface; growing a graded layer of strained single-crystal Si$_{1-x}$Ge$_x$ having a bottom surface overlying the Si substrate top surface and a top surface, where x increases with the Si$_{1-x}$Ge$_x$ layer thickness in the range between 0.03 and 0.5, and the thickness of the Si$_{1-x}$Ge$_x$ layer is in the range of 2500 to 5000 Å; implanting hydrogen ions; penetrating the Si substrate with the hydrogen ions a depth in the range of 300 to 1000 Å; implanting heavy ions, such as Si or Ge, into the Si$_{1-x}$Ge$_x$; in response to the heavy ion implantation, amorphizing a first region of the Si$_{1-x}$Ge$_x$ layer adjacent the Si substrate; annealing; in response to the annealing, forming a hydrogen platelets layer between the Si substrate and the Si$_{1-x}$Ge$_x$ layer; forming a silicon layer with a high density of hydrogen underlying the hydrogen platelets layer; and, forming a relaxed single-crystal Si$_{1-x}$Ge$_x$ region, free of defects.

Additional details of the above-described method, and a film structure with a relaxed layer of graded silicon germanium overlying a silicon substrate, are provided below.

BRIEF DESCRIPTION OF THE DRAWINGS

FIG. 5 is a flowchart illustrating the present invention method for forming a single-crystal silicon germanium film on a silicon substrate.

DETAILED DESCRIPTION OF THE PREFERRED EMBODIMENTS

Figure 1:
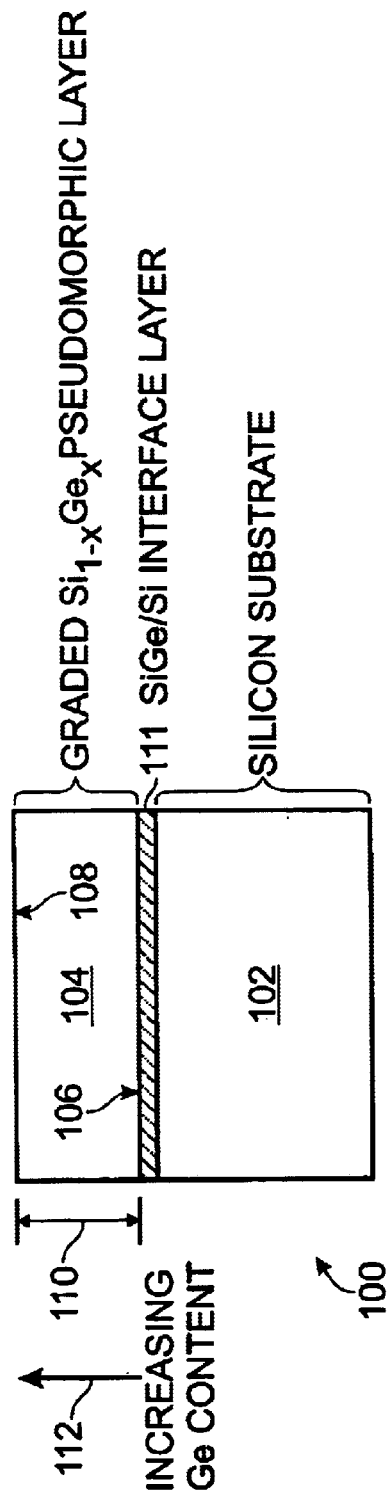
FIG. 1 illustrates a first step in the process of fabricating a relaxed layer of graded silicon germanium on a silicon substrate in accordance with the present invention.

FIG. 1 illustrates a first step in the process of fabricating a relaxed layer of graded silicon germanium on a silicon substrate in accordance with the present invention. The film structure 100 comprises a silicon substrate 102 and a graded layer of single-crystal $Si_{1-x}Ge_x$ 104. The $Si_{1-x}Ge_x$ layer 104 has a bottom surface 106, a top surface 108, and a thickness 110. The graded $Si_{1-x}Ge_x$ layer 104 has a thickness 110 in the range of 2500 to 5000 Å. An interface 111 is formed between the Si substrate 102 and the $Si_{1-x}Ge_x$ bottom surface 106. The $Si_{1-x}Ge_x$ layer 104 is single-crystal and tensile strained by the lattice of the underlying Si substrate 102.

As demonstrated with reference designator 112, the value of x increases with the $Si_{1-x}Ge_x$ layer thickness. That is, the Ge content is higher near the top surface 108 than it is near the bottom surface 106. Generally, the value of x varies in the range from 0.03 to 0.5. More specifically, x varies in the range from 0.03 to 0.1 at the bottom surface 106, and from 0.3 to 0.5 at the $Si_{1-x}Ge_x$ layer top surface 108. The Ge content can follow either a linear progression or a step-wise progression of increase.

Figure 2:
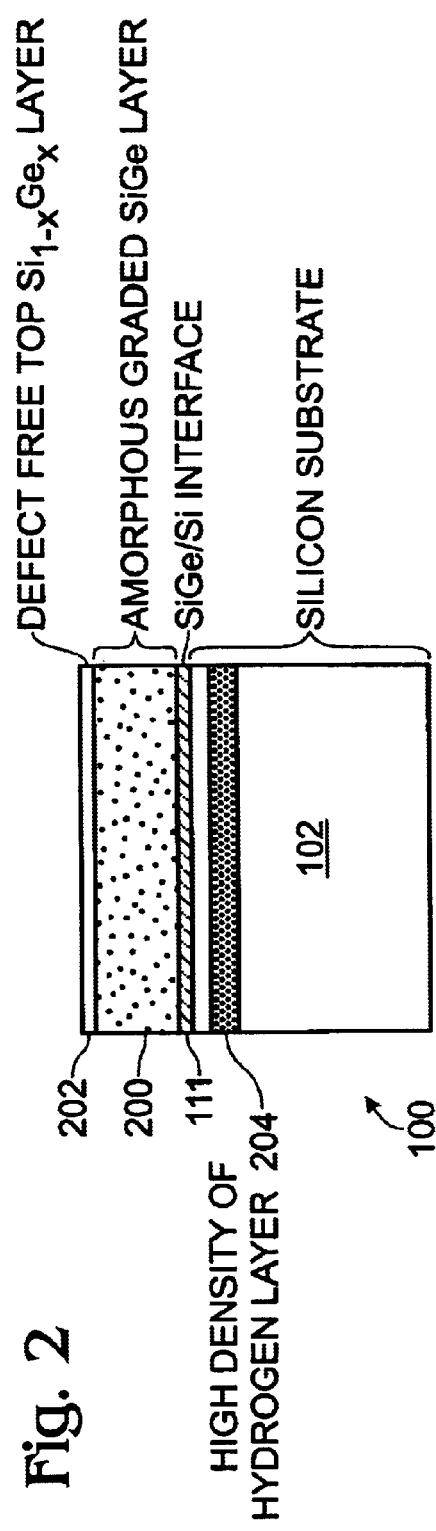
FIG. 2 illustrates the step of amorphizing the Si$_{1-x}$Ge$_x$ layer on the Si substrate of FIG. 1.

FIG. 2 illustrates the step of amorphizing the $Si_{1-x}Ge_x$ layer on the Si substrate 102 of FIG. 1. After a hydrogen ion implantation, either a Si or Ge ion implantation is used for amorphizing a portion of the $Si_{1-x}Ge_x$ layer 104 (See FIG. 1). Thus, a first layer 200 of amorphizied $Si_{1-x}Ge_x$ film is formed overlying the Si substrate 102 and a second layer of single-crystal $Si_{1-x}Ge_x$ 202 remains overlying the amorphizied layer 200. The hydrogen ions are implanted in a layer 204 into the Si substrate 102, as is described in more detail in the process explanation, below.

Figure 3:
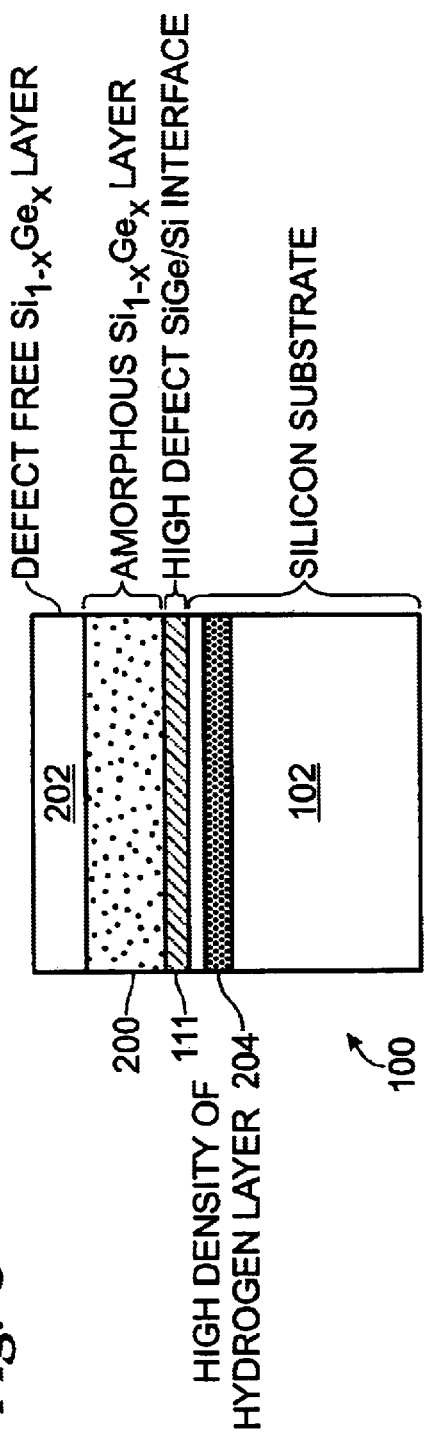
FIG. 3 illustrates the step of annealing the amorphizied Si$_{1-x}$Ge$_x$ layer of FIG. 2.

FIG. 3 illustrates the step of annealing the amorphizied $Si_{1-x}Ge_x$ layer 200 of FIG. 2. During annealing, solid phase epitaxial growth occurs in the amorphizied region 200 using the single crystal region of $Si_{1-x}Ge_x$ as a seed layer.

Figure 4:
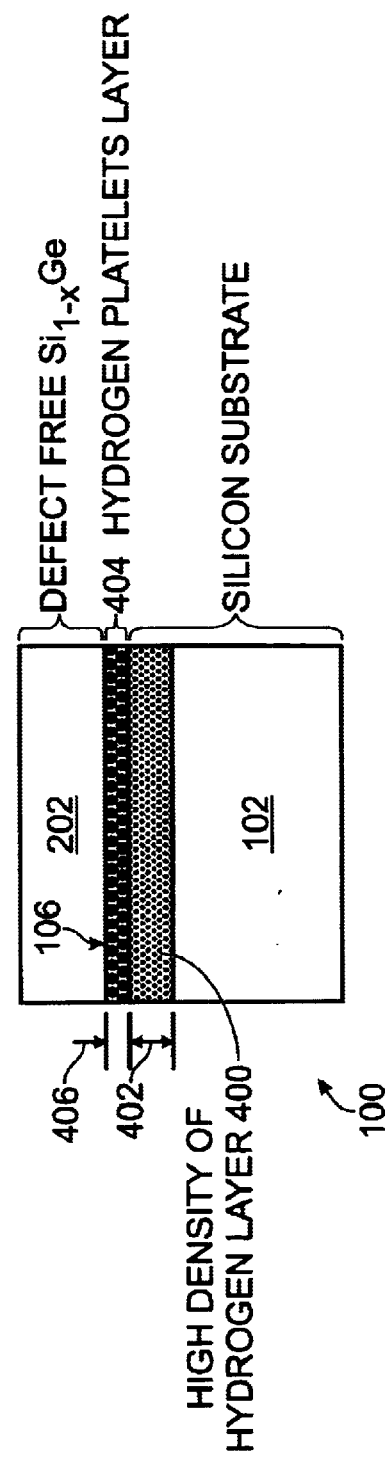
FIG. 4 illustrates the result of the annealing of the Si$_{1-x}$Ge$_x$ layer on the Si substrate of FIG. 3.

FIG. 4 illustrates the result of the annealing of the $Si_{1-x}Ge_x$ layer on the Si substrate 102 of FIG. 3. The Si substrate 102 includes a Si layer 400 with a high density of hydrogen ions, having a thickness 402 in the range of 300 to 1000 Å. It could also be said that the silicon layer 400 with a high density of hydrogen ions overlies the silicon substrate 102. A hydrogen platelets layer 404 overlies the Si layer 400 with the high density of hydrogen ions. The $Si_{1-x}Ge_x$ layer bottom surface 106 overlies the hydrogen platelets layer 404. The $Si_{1-x}Ge_x$ is now formed in a relaxed single-crystal structure. The hydrogen platelets layer 404 has a thickness 406 in the range of 300 to 1000 Å.

The present invention method of defect reduction grows a graded $Si_{1-x}Ge_x$ epitaxial layer to a thickness where the Ge content in the layer remains below a critical value, so that no relaxation occurs in the $Si_{1-x}Ge_x$ layer. The value of x at the bottom of the $Si_{1-x}Ge_x$ layer, at the $Si_{1-x}Ge_x$/Si interface, can be lower than 0.05 while at the top of the surface of the $Si_{1-x}Ge_x$ layer is 0.3 to 0.5, as desired. The Ge concentration may be increased linearly or step-wise with increases in the $Si_{1-x}Ge_x$ thickness. Since the SiGe film is free from relaxation, the top surface is free from defect.

Hydrogen ions are implanted into the $Si_{1-x}Ge_x$ film at a proper ion energy, so that they have a projected depth approximately 30 nm to 100 nm deeper than the $Si_{1-x}Ge_x$/Ge interface. Additionally high doses of heavy ions of silicon ions or of germanium ions are implanted into $Si_{1-x}Ge_x$ epilayer to amorphize the $Si_{1-x}Ge_x$ epilayer. Ideally, the entire $Si_{1-x}Ge_x$ layer except the top 10 nm to 50 nm is converted to amorphous structure. Further, multi-energy ion implantation is preferred for thicker $Si_{1-x}Ge_x$ films. During high temperature annealing, solid phase recrystallization occurs from the top high quality $Si_{1-x}Ge_x$ layer toward the $Si_{1-x}Ge_x$/Si interface. The hydrogen ions under the $Si_{1-x}Ge_x$/Si interface form hydrogen platelets and cavities, to terminate the threading dislocations, and to prevent the threading dislocations from propagating upward.

FIG. 5 is a flowchart illustrating the present invention method for forming a single-crystal silicon germanium film on a silicon substrate. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 500. Step 502 provides a silicon (Si) substrate with a top surface. Step 504 grows a graded layer of strained single-crystal $Si_{1-x}Ge_x$ having a bottom surface overlying the Si substrate top surface, and a top surface, where x increases with the $Si_{1-x}Ge_x$ layer thickness. Step 506 implants hydrogen ions. Step 510 implants heavy ions into the $Si_{1-x}Ge_x$. Step 512, in response to the heavy ion implantation, amorphizes a first region of the $Si_{1-x}Ge_x$ layer adjacent the Si substrate. Step 514 anneals. Step 516, in response to annealing, forms a hydrogen platelets layer between the Si substrate and the $Si_{1-x}Ge_x$ layer. Step 518, in response to annealing, forms a silicon layer with a high density of hydrogen underlying the hydrogen platelets layer. Step 520, in response to the annealing, forms a relaxed single-crystal $Si_{1-x}Ge_x$ region, free of defects.

In some aspects of the method, growing a graded layer of strained single-crystal $Si_{1-x}Ge_x$ in Step 504 includes growing a $Si_{1-x}Ge_x$ layer having thickness in the range of 2500 to 5000 Å. In other aspects, growing a graded layer of strained single-crystal $Si_{1-x}Ge_x$ includes growing $Si_{1-x}Ge_x$, where x varies in the range from 0.03 to 0.5. More specifically, growing a graded layer of $Si_{1-x}Ge_x$ includes growing $Si_{1-x}Ge_x$, where x varies in the range from 0.03 to 0.1 at the bottom surface, and where x varies from 0.3 to 0.5 at the $Si_{1-x}Ge_x$ layer top surface. In some aspects, the value of x increases with the layer thickness, with a linear increase. Alternately, the increase can be a step-wise increase.

In some aspects of the method, implanting hydrogen ions in Step 506 includes implanting hydrogen ions with a dosage in the order of $1 \times 10^{16}/cm^2$ to $4 \times 10^{16}/cm^2$ at an energy in the range from 40 thousand electron volts (keV) to 80 keV. Implanting hydrogen ions in Step 506 can also include the hydrogen ions penetrating into the Si substrate top surface a depth in the range of 300 Å to 1000 Å.

In one aspect of the method, implanting heavy ions into the $Si_{1-x}Ge_x$ in Step 510 includes implanting Si ions with a dosage in the order of $2 \times 10^{14}/cm^2$ to $2 \times 10^{15}/cm^2$ at an energy in the range of 60 keV to 200 keV. Alternately, Ge ions are implanted with a dosage in the order of $1 \times 10^{14}/cm^2$ to $1 \times 10^{15}/cm^2$ at an energy in the range of 100 keV to 500 keV.

In some aspects, amorphizing a first region of the $Si_{1-x}Ge_x$ layer adjacent the Si substrate in Step 512 includes forming a second region of single-crystal $Si_{1-x}Ge_x$ overlying the first region having a thickness in the range of 100 Å to 500 Å. Forming a single-crystal $Si_{1-x}Ge_x$ region in response to annealing can include using the second $Si_{1-x}Ge_x$ region as a seed crystal layer, growing the single-crystal second region into the amorphous first region.

In some aspects of the method, annealing includes heating the $Si_{1-x}Ge_x$ layer to a temperature in the range of 600 to 1100 degrees C. for a period of time in the range of 10 minutes to 60 minutes.

As mentioned above, multi-energy ion implantation is preferred with thicker SiGe films. For example, when Step 504 includes depositing a $Si_{1-x}Ge_x$ layer having thickness in the range of 4000 Å to 10,000 Å, then implanting heavy ions into the $Si_{1-x}Ge_x$ in Step 510 includes substeps. Step 510a is a first implanting of Si ions with a dosage in the order of $2\times10^{14}/cm^2$ to $2\times10^{15}/cm^2$ at an energy in the range of 60 keV to 200 keV. Step 510b is a second implanting of Si ions with a dosage in the order of $2\times10^{14}/cm^2$ to $2\times10^{15}/cm^2$ at an energy in the range of 200 keV to 400 keV. Alternately, Step 510a is a first implanting of Ge ions in the order of $1\times10^{14}/cm^2$ to $1\times10^{15}/cm^2$ and an energy in the range of 100 keV to 500 keV. Step 510b is a second implanting of Ge ions in the order of $1\times10^{14}/cm^2$ to $1\times10^{15}/cm^2$ and an energy in the range of 600 keV to 1000 keV.

With even thicker films a three-stage implantation process is used. For example, when Step 504 includes depositing a $Si_{1-x}Ge_x$ layer having thickness in the range of 8000 Å to 15,000 Å, Step 510 of implanting heavy ions into the $Si_{1-x}Ge_x$ includes other substeps. Step 510c is a first implanting of Si ions with a dosage in the order of $2\times10^{14}/cm^2$ to $2\times10^{15}/cm^2$ at an energy in the range of 60 keV to 200 keV. Step 510d is a second implanting of Si ions with a dosage in the order of $2\times10^{14}/cm^2$ to $2\times10^{15}/cm^2$ at an energy in the range of 200 keV to 400 keV. Step 510e is a third implanting of Si ions with a dosage in the order of $2\times10^{14}/cm^2$ to $1\times10^{15}/cm^2$ at an energy in the range of 400 keV to 800 keV.

Alternately, Step 510c is a first implanting of Ge ions with a dosage in the order of $1\times10^{14}/cm^2$ to $1\times10^{15}/cm^2$ and an energy in the range of 100 keV to 500 keV. Step 510d is a second implanting of Ge ions with a dosage in the order of $1\times10^{14}/cm^2$ to $1\times10^{15}/cm^2$ and an energy in the range of 600 keV to 1000 keV. Step 510e is a third implanting of Ge ions with a dosage in the order of $1\times10^{14}/cm^2$ to $1\times10^{15}/cm^2$ and an energy in the range of 1000 keV to 2000 keV.

A method for forming a single-crystal silicon germanium film on a silicon substrate, and a film structure with a relaxed layer of graded silicon germanium on a silicon substrate have been provided. A few examples have been given of specific process steps, such as energy levels and dosages. However, it should be understood that they are merely exemplary, and that other equivalent processes may be used to obtain the same results. Other variations and embodiments of the invention will occur to those skilled in the art.

We claim:

1. A method for forming a single-crystal silicon germanium film on a silicon substrate, the method comprising:
   providing a silicon (Si) substrate with a top surface;
   growing a graded layer of strained single-crystal $Si_{1-x}Ge_x$ having a bottom surface overlying the Si substrate top surface, and a top surface, where x increases with the $Si_{1-x}Ge_x$ layer thickness;
   implanting hydrogen ions;
   implanting heavy ions into the $Si_{1-x}Ge_x$;
   in response to the heavy ion implantation amorphizing a first region of the $Si_{1-x}Ge_x$ layer adjacent the Si substrate;
   annealing; and,
   in response to the annealing, forming a relaxed single-crystal $Si_{1-x}Ge_x$ region, free of defects.

2. The method of claim 1 further comprising:
   in response to annealing, forming a hydrogen platelets layer between the Si substrate and the $Si_{1-x}Ge_x$ layer.

3. The method of claim 2 further comprising:
   in response to annealing, forming a silicon layer with a high density of hydrogen underlying the hydrogen platelets layer.

4. The method of claim 3 wherein growing a graded layer of strained single-crystal $Si_{1-x}Ge_x$ includes growing a $Si_{1-x}Ge_x$ layer having thickness in the range of 2500 Å to 5000 Å.

5. The method of claim 4 wherein growing a graded layer of strained single-crystal $Si_{1-x}Ge_x$ includes growing $Si_{1-x}Ge_x$, where x varies in the range from 0.08 to 0.5.

6. The method of claim 5 wherein growing a graded layer of strained single-crystal $Si_{1-x}Ge_x$ includes growing $Si_{1-x}Ge_x$, where x varies in the range from 0.03 to 0.1 at the bottom surface, and where x varies from 0.3 to 0.5 at the $Si_{1-x}Ge_x$ layer top surface.

7. The method of claim 5 wherein growing a graded layer of strained single-crystal $Si_{1-x}Ge_x$ includes growing $Si_{1-x}Ge_x$, where the value of x increases with the layer thickness, with an increase selected from the group including a linear increase and a step-wise increase.

8. The method of claim 3 wherein depositing a graded layer of strained single-crystal $Si_{1-x}Ge_x$, includes depositing a $Si_{1-x}Ge_x$ layer having thickness in the range of 4000 Å to 10,000 Å, and,
   wherein implanting heavy ions into the $Si_{1-x}Ge_x$ includes:
   a first implanting of Si ions with a dosage in the order of $2\times10^{14}/cm^2$ to $2\times10^{15/cm2}$ at an energy in the range of 60 keV to 200 keV; and,
   a second implanting of Si ions with a dosage in the order of $2\times10^{14}/cm^2$ to $2\times10^{15}/cm^2$ at an energy in the range of 200 keV to 400 keV.

9. The method of claim 3 wherein depositing a graded layer of strained single-crystal $Si_{1-x}Ge_x$, includes depositing a $Si_{1-x}Ge_x$ layer having thickness in the range of 4000 Å to 10,000 Å; and,
   wherein implanting heavy ions into the $Si_{1-x}Ge_x$ includes:
   a first implanting of Ge ions with a dosage in the order of $1\times10^{14}/cm^2$ to $1\times10^{15}/cm^2$ and an energy in the range of 100 keV to 500 keV; and,
   a second implanting of Ge ions with a dosage in the order of $1\times10^{14}/cm^2$ to $1\times10^{15}/cm^2$ and an energy in the range of 600 keV to 1000 keV.

10. The method of claim 3 wherein depositing a graded layer of strained single-crystal $Si_{1-x}Ge_x$, includes depositing a $Si_{1-x}Ge_x$ layer having thickness in the range of 8000 Å to 15,000 Å; and,
    wherein implanting heavy ions into the $Si_{1-x}Ge_x$ includes:
    a first implanting of Si ions with a dosage in the order of $2\times10^{141}/cm^2$ to $2\times10^{15}/cm^2$ at an energy in the range of 60 keV to 200 keV;
    a second implanting of Si ions with a dosage in the order of $2\times10^{14}/cm^2$ to $2\times10^{15}/cm^2$ at an energy in the range of 200 keV to 400 keV; and,
    a third implanting of Si ions with a dosage m the order of $2\times10^{14}/cm^2$ to $1\times10^{15}/cm^2$ at an energy in the range of 400 keV to 800 keV.

11. The method of claim 3 wherein depositing a graded layer of strained single-crystal $Si_{1-x}Ge_x$, includes depositing a $Si_{1-x}Ge_x$ layer having thickness in the range of 8000 Å to 15,000 Å; and,
    wherein implanting heavy ions into the $Si_{1-x}Ge_x$ includes:
    a first implanting of Ge ions with a dosage in the order of $1\times10^{14}/cm^2$ to $1\times10^{15}/cm^2$ and an energy in the range of 100 keV to 500 keV;
    a second implanting of Ge ions with a dosage in the order of $1\times10^{14}/cm^2$ to $1\times10^{15}/cm^2$ and an energy in the range of 600 keV to 1000 keV; and,
    a third implanting of Ge ions with a dosage in the order of $1\times10^{14}/cm^2$ to $1\times10^{15}/cm^2$ and an energy in the range of 1000 keV to 2000 keV.

12. The method of claim 1 wherein implanting hydrogen ions includes implanting hydrogen ions with a dosage in the order of $1\times10^{16}/cm^2$ to $4\times10^{16}/cm^2$ at an energy in the range from 40 keV to 80 keV.

13. The method of claim 1 wherein implanting hydrogen ions includes the hydrogen ions penetrating into the Si substrate top surface a depth in the range of 300 Å to 1000 Å.

14. The method of claim 1 wherein implanting heavy ions into the $Si_{1-x}Ge_x$ includes implanting Si ions with a dosage in the order of $2\times10^{14}/cm^2$ to $2\times10^{15}/cm^2$ at an energy in the range of 60 keV to 200 keV.

15. The method of claim 1 wherein implanting heavy ions into the $Si_{1-x}Ge_x$ includes implanting Ge ions with a dosage in the order of $1\times10^{14}/cm^2$ to $1\times10^{15}/cm^2$ at an energy in the range of 100 keV to 500 keV.

16. The method of claim 1 wherein amorphizing a first region of the $Si_{1-x}Ge_x$ layer adjacent the Si substrate includes forming a second region of single-crystal $Si_{1-x}Ge_x$ overlying the first region having a thickness in the range of 100 Å to 500 Å.

17. The method of claim 16 wherein forming a relaxed single-crystal $Si_{1-x}Ge_x$ region in response to annealing includes, using the second $Si_{1-x}Ge_x$ region as a seed crystal layer, growing the single-crystal second region into the amorphous first region.

18. The method of claim 16 wherein annealing includes heating the $Si_{1-x}Ge_x$ layer to a temperature in the range of 600 to 1100 degrees C for a period of time in the range of 10 minutes to 60 minutes.

19. A method for forming a single-crystal silicon germanium film on a silicon substrate, the method comprising:

providing a silicon (Si) substrate with a top surface;

growing a graded layer of strained single-crystal $Si_{1-x}Ge_x$ having a bottom surface overlying the Si substrate top surface and a top surface, where x increases with the $Si_{1-x}Ge_x$ layer thickness in the range between 0.03 and 0.5, and wherein the $Si_{1-x}Ge_x$ layer has a thickness in the range of 2500 Å to 5000 Å;

implanting hydrogen ions;

penetrating the Si substrate with the hydrogen ions a depth in the range of 300Å to 1000 Å;

implanting heavy ions, selected from the group including Si and Ge, into the $Si_{1-x}Ge_x$;

in response to the heavy ion implantation, amorphizing a first region of the $Si_{1-x}Ge_x$ layer adjacent the Si substrate;

annealing;

in response to the annealing, forming a hydrogen platelets layer between the Si substrate and the $Si_{1-x}Ge_x$ layer;

forming a silicon layer with a high density of hydrogen underlying the hydrogen platelets layer; and, forming a relaxed single-crystal $Si_{1-x}Ge_x$ region, free of defects.

* * * * *